(12) United States Patent  
Kabasawa

(10) Patent No.: US 7,397,644 B2  
(45) Date of Patent: Jul. 8, 2008

(54) POWER SUPPLY DEVICE AND ELECTRIC CIRCUIT

(75) Inventor: Takashi Kabasawa, Maebashi (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 241 days.

(21) Appl. No.: 11/305,221

(22) Filed: Dec. 19, 2005

(65) Prior Publication Data

US 2006/0132142 A1 Jun. 22, 2006

(30) Foreign Application Priority Data

Dec. 21, 2004 (JP) ............................ 2004-369343

(51) Int. Cl.  
*H02H 5/04* (2006.01)

(52) U.S. Cl. ..................... 361/93.9; 361/93.8

(58) Field of Classification Search .............. 361/86, 361/87, 93.7–93.9  
See application file for complete search history.

(56) References Cited

U.S. PATENT DOCUMENTS 4,931,778 A * 6/1990 Guajardo ............... 340/664

FOREIGN PATENT DOCUMENTS

JP 8-308143 11/1996

* cited by examiner

*Primary Examiner*—Michael J Sherry  
*Assistant Examiner*—Danny Nguyen  
(74) *Attorney, Agent, or Firm*—Westerman, Hattori, Daniels & Adrian, LLP.

(57) ABSTRACT

An FET for malfunction check is connected between the gate and source of an FET for power-source output control, which is connected in series in a power output line from a battery used as a power source for a load. A malfunction determination circuit determines whether the FET for power-source output control is operating normally or not, by monitoring output voltage of the FET for malfunction check. Further, the malfunction determination circuit identifies malfunction of the FET for power-source output control due to short-circuiting during actual use.

6 Claims, 2 Drawing Sheets

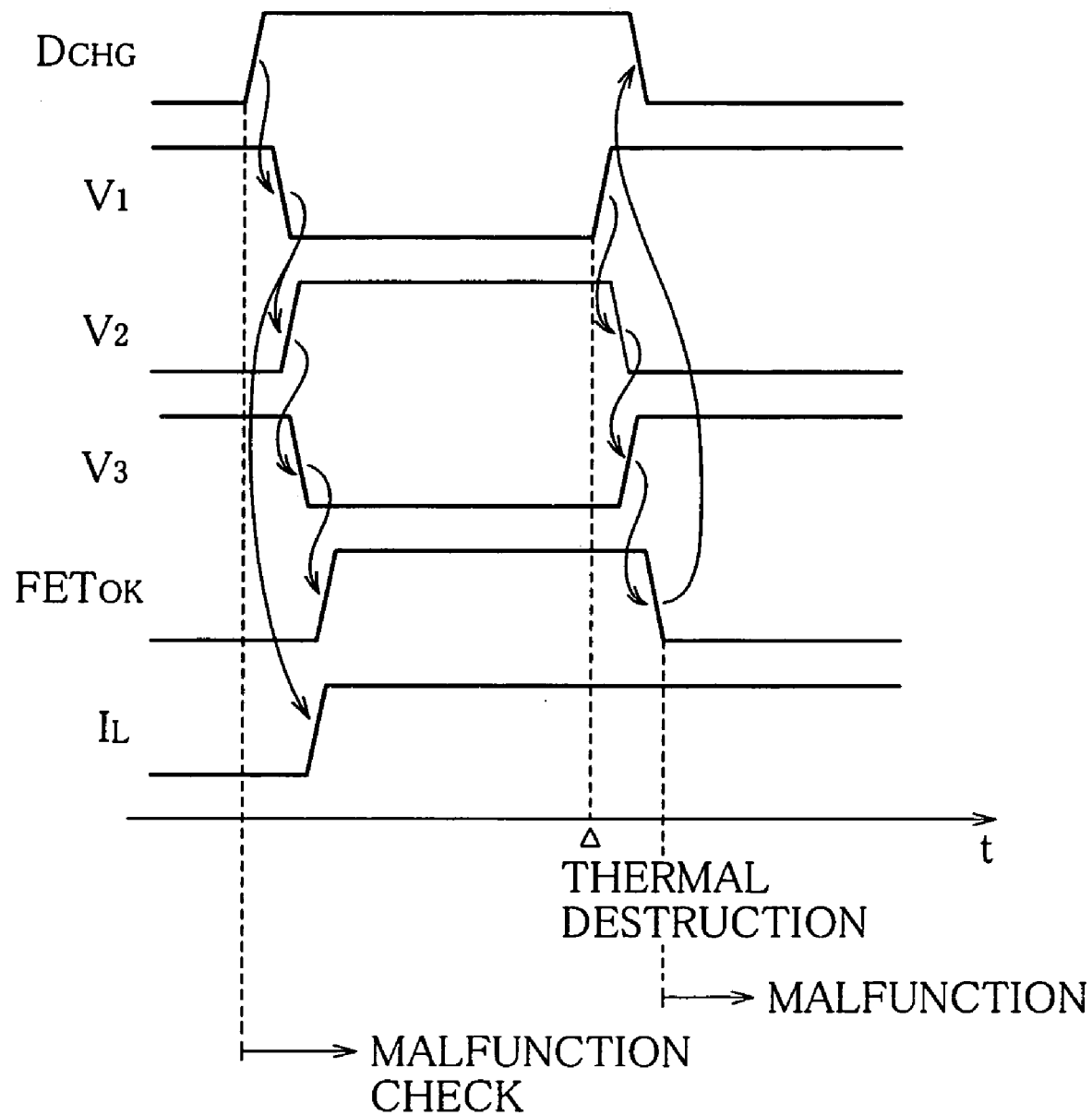

POWER SUPPLY DEVICE AND ELECTRIC CIRCUIT

BACKGROUND OF THE INVENTION

1. Field of the Invention

This invention relates to a power supply device and an electric circuit, including a battery used as a power source for a load and having a function of easily monitoring whether an FET (field-effect transistor) for power-source output control, connected in series in a power output line from the battery, is operating normally or not (malfunction check function).

2. Description of the Related Art

A battery is used as a power source for driving loads such as robots and communication devices of various types. In a power supply device using a rechargeable battery such as an Ni-MH battery (nickel-hydride metal battery) or an Li ion battery, a switching device such as an FET is exclusively connected in series in a power output line from the battery. The switching device is brought into off-state, for example, when an overcurrent due to, for example, short-circuiting of a load is detected or output voltage is not sufficient. By the switching device coming into off-state, the rechargeable battery and the load are disconnected, so that the rechargeable battery is protected.

In the power supply device of this type, the FET (switching device) operating normally is a key to ensuring operational reliability of the power supply device. Hence, conventionally, as disclosed in Japanese Unexamined Patent Publication No. Hei 8-308143, a monitoring circuit for monitoring the source voltage of the FET is provided to detect malfunction due to formation of an open circuit between the gate and source of the FET (malfunction of the FET). When malfunction of the FET is detected, a warning is issued.

This malfunction check is carried out exclusively by making the power supply device operate with the load disconnected, and determining whether or not the power supply device is functioning normally in this state. Thus, the procedure is cumbersome, and malfunction check on the FET cannot be carried out in real time while the power supply device is being used actually. Further, malfunction of the FET is mostly due to thermal destruction, namely short-circuiting of the gate and source due to heat generated while the FET is operating. Hence, it is important to detect malfunction of the FET immediately while the power supply device is being used actually.

SUMMARY OF THE INVENTION

An object of this invention is to provide a power supply device including a switching device (FET) for controlling power supply from a battery to a load, and having a malfunction check function capable of immediately detecting malfunction of the FET due to short-circuiting while the power supply device is being used actually.

In order to achieve this object, this invention notes that malfunction of a switching device (FET) for controlling power supply from a battery to a load is mostly due to thermal destruction, namely short-circuiting of the gate and source due to heat, and that the short-circuiting of the gate and source of the FET causes short-circuiting of the drain and source thereof, so that all the terminals are short-circuited.

Thus, in a power supply device according to this invention, an FET for malfunction check is connected between the gate and source of an FET for power-source output control, which is connected in series in a power output line from a battery used as a power source for a load, and a malfunction determination circuit determines whether the FET for power-source output control is operating normally or not, by monitoring output voltage of the FET for malfunction check.

In an aspect of this invention, the battery is a rechargeable battery such as an Ni-MH battery and an Li ion battery. The FET for power-source output control is a large-power switching FET controlled to be in off- or on-state, by a rechargeable battery charge/discharge control circuit controlling the gate voltage thereof. If the output voltage of the FET for malfunction check disappears (becomes 0V) while the FET for power-source output control is controlled to be in on-state, the malfunction determination circuit determines that this indicates malfunction of the FET for power-source output control due to short-circuiting.

Further, an electric circuit according to this invention comprises an FET for output control connected in series in an output line along which power or a signal is supplied, and an FET for malfunction check connected between the gate and source of the FET for output control.

In the power supply device having the above-described structure, the FET for malfunction check connected between the gate and source of the FET for power-source output control comes into on- or off-state according as the FET for power-source output control comes into on- or off-state. However, if the gate and source of the FET for power-source output control are short-circuited, for example, due to heat, and this causes short-circuiting of the drain and source of this FET, the FET for malfunction check stays in off-state. In other words, when the FET for power-source output control suffers a short circuit, the output voltage (drain voltage) of the FET for power-source output control does not change, but the voltage across the source and gate of the FET for malfunction check, connected between the gate and source of the FET for power-source output control, becomes 0V, so that the FET for malfunction check does not come into on-state.

Thus, depending on whether the FET for malfunction check is in on-state or off-state, or in other words, by monitoring the output voltage (source voltage) of the FET for malfunction check, whether or not the FET for power-source output control is malfunctioning due to short-circuiting can be determined easily and with certainty. Thus, malfunction check on the FET for power-source output control can be carried out in real time while the power supply device is being used actually, without taking the trouble to disconnect a load and set the power supply device to a malfunction check mode. This makes it possible to detect malfunction of the FET for power-source output control due to short-circuiting, immediately.

Likewise, in the electric circuit according to this invention, malfunction check on the FET for output control, inserted in the power or signal output line can be carried out in real time.

BRIEF DESCRIPTION OF THE DRAWINGS

The present invention will become more fully understood from the detailed description given hereinafter and the accompanying drawings which are given by way of illustration only, and thus, are not limitative of the present invention, and wherein:

FIG. 2 is a waveform diagram showing how malfunction of an FET for power-source output control included in the power supply device of FIG. 1 due to short-circuiting is detected.

DETAILED DESCRIPTION OF THE PREFERRED EMBODIMENT

Figure 1:
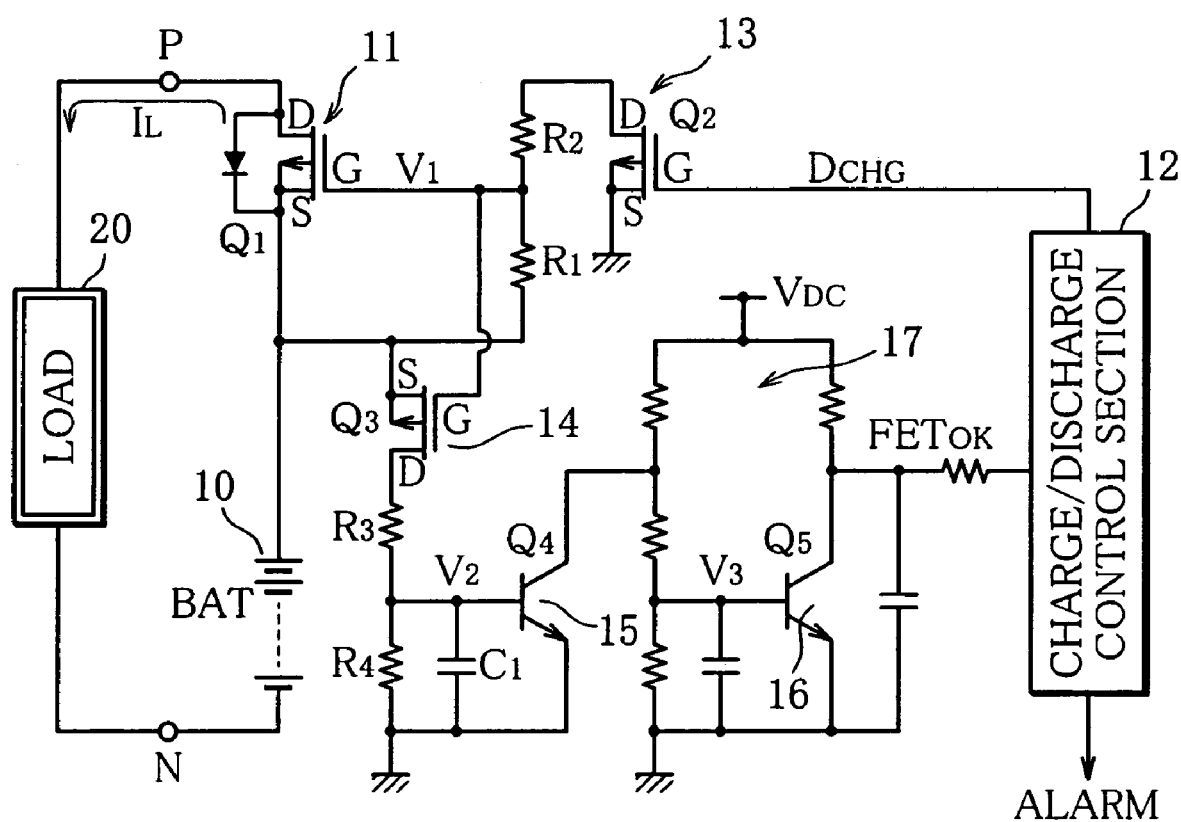
FIG. 1 is a diagram showing schematic structure of a power supply device in an embodiment of this invention.

Referring to the drawings, a power supply device in an embodiment of this invention will be described below.

FIG. 1 is a diagram showing schematic structure of a power supply device in an embodiment of this invention. Reference sign 10 indicates a battery (BAT) such as an Ni-MH battery or an Li ion battery. The power supply device uses this battery 10 as a power source for a load 20. The power supply device includes a large-power switching FET (Q1) 11 connected in series in a power output line from the battery 10 and used as a switching device for power-source output control. In this example, the source of the FET 11 is connected to the positive electrode (+) of the battery 10, and the drain of the FET 11 is connected to a positive terminal P of the power supply device. The power supply line for the load 20 is formed such that the load 20 is connected between the above-mentioned positive terminal P and a negative terminal N of the power supply device, which is connected to the negative electrode (−) of the battery 10.

The FET 11 is controlled to be in on- or off-state by its gate receiving output V1 of a control transistor (FET; Q2) 13. The control transistor (FET; Q2) 13 comes into on- or off-state receiving a control signal $D_{CHG}$ from a charge/discharge control section 12 comprising a microcomputer, etc. Specifically, the FET 11 is arranged such that a resistor R1 is connected between the source and gate thereof and the gate is connected in series to the control transistor (FET; Q2) 13 with a resistor R2 between. When the control transistor (FET; Q2) 13 comes into on-state, the voltage of the battery 10 divided by the resistors R1 and R2 is supplied to the gate of the FET 11, as gate control voltage V1. Supplied with the gate voltage V1, the FET 11 comes into on-state (conducting state). When the control transistor (FET; Q2) 13 comes into off-state, flow of a current is cut off by the control transistor 13. Consequently, the full output voltage of the battery 10 is supplied to the gate of the FET 11, so that the voltage across the gate and source of the FET 11 becomes 0, so that the FET 11 come into off-state (non-conducting state).

Further, an FET for malfunction check (Q3) 14 is connected between the source and gate of the FET 11. Specifically, the source and gate of the FET 14 are connected to the source and gate of the FET 11, respectively. The drain, namely the output terminal of the FET 14 is connected to earth, with resistors R3 and R4 in series between. A transistor (Q4) 15 for detecting the output voltage of the FET 14 is connected in the FET 14 output circuit. Further, a transistor (Q5) 16 having a delaying and voltage-inverting function and functioning as an output buffer is connected to the output terminal of the transistor 15.

A malfunction determination circuit 17 comprising the transistors 15, 16 as main components determines whether or not the FET 14 is in on-state, by monitoring the output voltage V2 of the FET 14, which the voltage of the battery 10 divided by the resistors R3, R4 if the FET (Q3) 14 for malfunction check is in on-state. When it is determined that the FET 14 is in on-state, the transistor (Q5) 16 sends out a signal $FET_{OK}$ indicating that the FET 11 for power-source output control is functioning normally. The signal $FET_{OK}$ is supplied to the charge/discharge control section 12.

Receiving the signal $FET_{OK}$, the charge/discharge control section 12 sends out the above-mentioned control signal $D_{CHG}$ for power-source output, continuously. When the supply of the signal $FET_{OK}$ stops, the charge/discharge control section 12 stops sending out the control signal $D_{CHG}$, determining that the FET 11 for power-source output control malfunctions due to short-circuiting. By the control signal $D_{CHG}$ being stopped, the control transistor (Q2) 13 is brought into off-state. At the same time, the charge/discharge control section 12 issues a warning (alarm) indicative of malfunction of the FET 11 due to short-circuiting.

Thus, in the power supply device having the structure described above, malfunction is detected as the waveform diagram of FIG. 2 schematically shows. Specifically, when the FET (Q1) 11 for power-source output control functions normally, the FET (Q3) 14 for malfunction check comes into on- or off-state according as the FET 11, whose operation is controlled by the charge/discharge control section 12, comes into on- or off-state. Hence, when the control signal $D_{CHG}$ is sent out to bring the FET 11 into on-state, if the output voltage V2 of the FET 14 reaches a specified voltage level, it can be determined that the FET 11 does not suffer a short circuit. Thus, it can be determined that power is normally supplied from the battery 10 to the load 20, through the FET 11.

Meanwhile, even when the FET (Q1) 11 for power-source output control is destroyed by heat such that the source and gate thereof are short-circuited, and this causes short-circuiting of the source and drain thereof, power supply through the FET (Q1) 11 continues. In other words, although the function of the FET 11 is damaged, power is kept being supplied from the power source 10 to the load 20. However, in this case, since the FET 11 suffers a short circuit, the voltage across the source and gate of the FET (Q3) 14 for malfunction check becomes 0. Consequently, the FET 14 comes into off-state (non-conducting state), so that the output voltage V2 of the FET 14 becomes 0V. By detecting this reduction of the output voltage V2, the malfunction determination circuit 17 identifies malfunction of the FET 11 for power-source output control due to short-circuiting, as described above.

Thus, in the power supply device having the FET (Q3) 14 for malfunction check and the malfunction determination circuit 17 for monitoring the output of the FET 14, whether or not the FET (Q1) 11 for power-source output control malfunctions due to short-circuiting can be monitored in real time while the power supply device is being used actually in an ordinary manner. When malfunction of the FET 11 due to short-circuiting is detected, an alarm can be issued immediately to request a remedy to it. Further, whether the FET 11 is operating normally or not can be checked all the time while the power supply device is being used actually, without setting the power supply device to a special mode for malfunction check as in the conventional case. This provides practically great beneficial effects, such that reliability of the power supply device is sufficiently improved, or in other words, the operation of the power supply device is sufficiently ensured.

The present invention is not limited to the described embodiment. For example, it can be modified such that the FET (Q1) for output control and the FET (Q3) for malfunction check are combined into an FET having a malfunction check function. Further, in the above-described embodiment, the FET (Q1) 11 for power-source output control is connected in series to the battery 10 for power supply from the battery 10, and the FET (Q3) for malfunction check is connected between the source and gate of the FET 11 to detect malfunction of the FET 11. However, it can be arranged such that in an electric circuit where an FET for output control is simply connected in series in a power or signal output line, an FET for malfunction check is connected between the gate and source of the FET for output control to detect malfunction of the FET for output control.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power supply device used as a power source for a load, comprising:
   an FET for power-source output control connected in series in a power output line,
   an FET for malfunction check connected between the gate and source of the FET for power-source output control, and
   a malfunction determination circuit for determining whether the FET for power-source output control is operating normally or not, by monitoring output voltage of the FET for malfunction check,
   wherein the FET for power-source output control is controlled to be in on- or off-state by a charge/discharge control circuit controlling gate voltage of the FET for power-source output control, and
   when the output voltage of the FET for malfunction check disappears while the FET for power-source output control is controlled to be in on-state, the malfunction determination circuit determines that this indicates malfunction of the FET for power-source output control due to short-circuiting.

2. The power supply device according to claim 1, wherein
   the FET for power-source output control forms a power output line from a positive electrode of a rechargeable battery, with its source connected to the positive electrode of the rechargeable battery and its drain connected to a load,
   the FET for malfunction check is connected between the gate and source of the FET for power-source output control, with its source and gate connected to the source and gate of the FET for power-source output control, respectively, and
   the malfunction determination circuit detects drain voltage of the FET for malfunction check.

3. The power supply device according to claim 1, wherein the malfunction determination circuit determines malfunction of the FET for power-source output control from the drain voltage of the FET for malfunction check.

4. The A power supply device used as a power source for a load, comprising:
   an FET for power-source output control connected in series in a power output line,
   an FET for malfunction check connected between the gate and source of the FET for power-source output control, and
   a malfunction determination circuit for determining whether the FET for power-source output control is operating normally or not, by monitoring output voltage of the FET for malfunction check,
   wherein the FET for power-source output control forms a power output line from a positive electrode of a rechargeable battery, with its source connected to the positive electrode of the rechargeable battery and its drain connected to a load,
   the FET for malfunction check is connected between the gate and source of the FET for power-source output control, with its source and gate connected to the source and gate of the FET for power-source output control, respectively, and
   the malfunction determination circuit detects drain voltage of the FET for malfunction check.

5. The power supply device according to claim 1 or 4, wherein
   the FET for power-source output control and the FET for malfunction check are combined into an FET having a malfunction check function.

6. The power supply device according to claim 4, wherein the malfunction determination circuit determines malfunction of the FET for power-source output control due to short-circuiting.

* * * * *